United States Patent [19]
Neubecker et al.

[11] Patent Number: 5,990,269
[45] Date of Patent: Nov. 23, 1999

[54] COPOLYMER OF VINYLPYRROLIDONE AND VINYLIMIDAZOLE

[75] Inventors: Karin Neubecker, Frankenthal; Stefan Stien, Saulheim; Stephan Kothrade, Limburgerhof, all of United Kingdom

[73] Assignees: BASF Aktiengesellschaft, Ludwigshafen, Germany; Tokyo Ohka Kogyo Co., Ltd., Kanagawa-ken, Japan

[21] Appl. No.: 08/975,684

[22] Filed: Nov. 21, 1997

Related U.S. Application Data

[62] Division of application No. 08/590,475, Jan. 24, 1996, Pat. No. 5,725,978.

[30] Foreign Application Priority Data

Jan. 31, 1995 [JP] Japan .................................. 7-34208
Oct. 28, 1995 [JP] Japan ................................. 7-303723

[51] Int. Cl.⁶ .................. C08G 69/00; C08F 226/06; C08F 271/02; C08F 279/00
[52] U.S. Cl. .................. 528/327; 528/310; 528/322; 525/279; 525/281; 525/412; 525/479
[58] Field of Search .................. 528/327, 310, 528/522; 525/412, 279, 281, 479

[56] References Cited

U.S. PATENT DOCUMENTS

| | | | |
|---|---|---|---|
| 3,917,794 | 11/1975 | Akagi et al. | 427/68 |
| 4,229,514 | 10/1980 | Kurita et al. | 430/195 |
| 4,241,162 | 12/1980 | Hatano et al. | 430/195 |
| 4,442,196 | 4/1984 | Iwaki et al. | 430/195 |
| 5,024,920 | 6/1991 | Morishita et al. | 430/325 |
| 5,254,431 | 10/1993 | Etherington et al. | 430/171 |
| 5,424,368 | 6/1995 | Miyazaki et al. | 430/195 |
| 5,622,926 | 4/1997 | Schade et al. | 510/340 |

FOREIGN PATENT DOCUMENTS

| | | |
|---|---|---|
| 635 565 | 1/1995 | European Pat. Off. |
| 28 14 287 | 10/1979 | Germany . |
| 42 35 798 A1 | 10/1992 | Germany . |
| 42 44 386 A1 | 12/1992 | Germany . |
| 43 16 023 | 11/1994 | Germany . |
| 48-79970 | 10/1973 | Japan . |
| 51 003 645 | 6/1974 | Japan . |
| 2-173007 | 7/1990 | Japan . |
| 2-204750 | 8/1990 | Japan . |
| 4-050205 | 2/1992 | Japan . |
| 5-011442 | 1/1993 | Japan . |
| 5-067433 | 3/1993 | Japan . |
| 8-510278 | 10/1996 | Japan . |

*Primary Examiner*—P. Hampton-Hightower
*Attorney, Agent, or Firm*—Wenderoth, Lind & Ponack L.L.P.

[57] ABSTRACT

The improved water-soluble photosensitive resin composition comprises a high-polymer compound represented by the general formula (I):

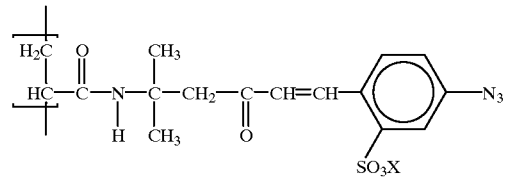

(where X is Na, K or $NH_4$) and a water-soluble polymer which is either polyvinylpyrrolidone or a copolymer of vinylpyrrolidone and vinylimidazole or both. The composition is applied to a substrate, exposed through a mask pattern and developed to form a photocured pattern and, thereafter, a light absorber is applied to the entire surface of the substrate and dried, followed by stripping away the photocured pattern and the overlying light absorber to form a black matrix pattern. The composition is suitable for use as a photoresist in the manufacture of black matrices as on color CRTs and capable of efficient formation of photocured patterns with high sensitivity by shorter times and lower intensities of exposure. In addition, the composition adheres strongly to glass substrates and is capable of pattern formation as thin film that is faithful to the mask pattern used. A vinylpyrrolidone/vinylimidazole copolymer is also disclosed.

2 Claims, 1 Drawing Sheet

COPOLYMER OF VINYLPYRROLIDONE AND VINYLIMIDAZOLE

This application is a division of application Ser. No. 08/590,475, filed Jan. 24, 1996, now U.S. Pat. No. 5,725,978.

BACKGROUND OF THE INVENTION

1. Field of the Invention

This invention relates to a water-soluble photosensitive resin composition useful in the manufacture of black matrices typically used on the phosphor screen of a color CRT. More specifically, the invention relates to a water-soluble photosensitive resin composition that comprises a water-soluble polymer and a light-sensitive component and that exhibits good enough adhesion to glass substrates to enable the formation of thin-film patterns but which yet can be readily stripped at a subsequent stage. The invention also relates to a method of forming a black matrix pattern on the substrate using said water-soluble photosensitive resin composition.

2. Description of the Related Art

The black matrix for use on the phosphor screen of a color CRT as in a color television set has a light absorber (e.g., graphite) formed in a specified pattern on the inner surface of a glass panel, with the non-patterned areas consisting of many small holes (black matrix holes) or stripes (black stripes). The black matrix holes or stripes are filled with the phosphors of three primary colors, typically red(R), green (G) and blue(B), to provide a pattern of three primary phosphor dots. Electron beams emitted from electron gun(s) are passed through the perforations in a shadow mask to selectively stimulate the phosphor dots, thereby forming a color image on the panel.

A color CRT of this shadow-mask type requires that the positions of the phosphor dots formed on the inner surface of the glass panel should be in registry with those of the perforations in the shadow mask (through which electron beams will pass); if this requirement is not met, the emitted electron beams will either fail to strike the intended phosphors or strike unwanted phosphors, thereby reducing the fidelity of color reproduction. Hence, it is necessary in the formation of a black matrix pattern to provide the inner surface of the glass panel with black matrix holes or stripes in positions that are in good registry with the perforations in the shadow mask. Under the circumstances, the shadow mask for use on a color CRT is commonly employed as an exposure mask in the formation of black matrix patterns.

A customary process of forming a black matrix pattern comprises the steps of applying a water-soluble photosensitive resin composition onto the inner surface of a panel to form a photoresist layer, exposing the photoresist layer to light through a shadow mask, thereby causing the exposed areas to cure, developing the resist layer to remove the unexposed areas, thereby forming a photocured pattern, thereafter applying a light absorber to the entire surface of the substrate including the photocured pattern and the uncovered areas, and drying the applied absorber to form a black film. Subsequently, the photocured pattern and the overlying black film as well are stripped away to form a black matrix pattern having matrix holes or stripes formed in positions that are in registry with the perforations in the shadow mask. The thus formed matrix holes or stripes are filled with the phosphors of three primary colors, R, G and B, to form a phosphor screen having patterns of the three primary phosphors.

The water-soluble photosensitive resin compositions conventionally used in the formation of black matrix patterns are based either on a system consisting of polyvinylalcohol and bichromates or on a system consisting of water-soluble polymers and water-soluble bisazide compounds. However, these systems have their own problems. The first system consisting of polyvinylalcohol and bichromates has the disadvantage of experiencing increasing changes in sensitivity with time, having low resolution and causing an increase in the crosslinked region due to dark reaction that occurs after the termination of exposure. Therefore, if exposure, development and phosphor filling steps are repeated through three cycles in order to form successive patterns of three primary phosphors, the light being applied to the photoresist layer will inevitably overlap between patterns. In such case there is high likelihood for the occurrence of a phenomenon generally called "docking" in which any two adjacent patterns of different colored phosphors that should ideally be separated from each other come into contact. This has been a problem of particularly great concern in "gap exposure" which is performed with the mask spaced from the photoresist layer.

With a view to getting around the "docking" difficulty, several proposals have been made as exemplified by the teaching of Unexamined Published Japanese Patent Application(kokai) No.79970/1973, which relates the method of using polyvinylpyrrolidone as the water-soluble polymer component of a water-soluble photosensitive resin composition, the other component of which is a water-soluble bisazide compound. According to the teaching of that patent, the use of polyvinylpyrrolidone experiences reciprocity law failure, i.e., an effect in which the crosslinking caused by light illumination will hardly proceed if the integrated illumination is below a certain level; hence, the degree of crosslinking of the photoresist layer has such a profile that it increases abruptly in areas relatively close to the center of the beam passing hole whereas it drops markedly farther away from the center. Hence, the degree of crosslinking near the peripheral edge of the beam passing hole is short of the minimum level necessary to form dots and the diameter of the resulting dots is sufficiently smaller than that of the beam passing hole to ensure against "docking". Systems consisting of water-soluble polymers and water-soluble bisazide compounds as taught in Unexamined Published Japanese Patent Application(kokai)No.79970/1973, supra, have high resolution but, on the other hand, they have low sensitivity and adhere so poorly to glass substrates that contact enhancing agents such as water-soluble silane coupling agents have to be added in amounts greater than certain levels; in addition, the thickness of the photoresist layer cannot be substantially reduced because pattern washout will occur during development unless the photoresist layer is formed in thicknesses greater than certain levels. Besides these manufacturing problems from the viewpoints of efficiency and cost, the photoresist layer cannot be completely stripped away and phosphors will adhere to the residual photoresist layer in the subsequent step, which can be a cause of color mixing.

A system that has a light-sensitive group introduced into the water-soluble polymer has been proposed as one that is improved in pattern configuration and resolution but this approach has not yet been commercialized due to difficulties in sensitivity and stability.

The present inventor conducted intensive studies in order to solve the aforementioned problems of the prior art and found that they could be solved by a water-soluble photosensitive resin composition based on a system consisting of a water-soluble polymer and a light-sensitive component, in which either polyvinylpyrrolidone or a copolymer of vinylpyrrolidone and vinylimidazole or both are used as said water-soluble polymer and in which a high-polymer compound having a specified structural unit is used as the light-sensitive component. The present invention has been accomplished on the basis of this finding.

SUMMARY OF THE INVENTION

An object, therefore, of the invention is to provide a water-soluble photosensitive resin composition which, when used as a photoresist in the manufacture of black matrices as on color CRTs, is capable of efficient formation of photo-cured patterns with high sensitivity by shorter times and smaller intensities of exposure.

Another object of the invention is to provide a water-soluble photosensitive resin composition that adheres strongly to glass substrates and which is capable of pattern formation even if it is applied in thin films.

Yet another object of the invention is to provide a water-soluble photosensitive resin composition that is easy to strip.

A further object of the invention is to provide a method of forming a black matrix pattern on a substrate that has high fidelity to a shadow mask pattern.

Thus, according to its first aspect, the invention relates to a water-soluble resin composition comprising a high-polymer compound having a structural unit represented by the following general formula (I):

(where X is Na, K or $NH_4$) and a water-soluble polymer, characterized in that said water-soluble polymer is either polyvinylpyrrolidone or a copolymer of vinylpyrrolidone and vinyl imidazole or both.

The second aspect of the invention relates to a method of forming a black matrix pattern comprising the steps of applying the above-defined water-soluble photosensitive resin composition to a substrate, exposing the applied composition through a mask pattern, developing the composition to form a photocured pattern, applying a light absorber to the entire surface of the substrate, drying the applied coat, and stripping away said photocured pattern and the overlying light absorber.

The third aspect of the invention relates to copolymers of vinylpyrrolidone and vinylimidazole with a content of vinylimidazole of from 5 to 90 mol % and a K value of 30–100.

DETAILED DESCRIPTION OF THE INVENTION

The water-soluble polymer to be used in the invention is either polyvinylpyrrolidone or a copolymer of vinylpyrrolidone and vinylimidazole or both. These polymers may optionally be mixed with at least one compatible water-soluble high polymer. The term "vinylpyrrolidone" as used herein means N-vinyl-2-pyrrolidone and the term "vinylimidazole" covers all isomers such as N-vinyl, 2-vinyl and 4-vinyl forms.

The content of vinylimidazole in the copolymer of vinylpyrrolidone and vinylimidazole is selected from the range of 5–90 mol %, with the copolymer being taken as 100 mol %. If the vinyl imidazole content is less than 5 mol %, the strippability of the photoresist layer is insufficient to prevent the occurrence of residual photoresist, which is a potential cause of color mixing in the step of phosphor filling. If the vinylimidazole content exceeds 90 mol %, it is difficult in the state of the art to synthesize water-soluble polymers (i.e., copolymers) having high degrees of polymerization (or high molecular weights) and low-molecular weight copolymers are the only products available today. However, the use of water-soluble polymers of low molecular weights generally results in the production of resin compositions having lower sensitivity and, hence, it is preferred to use copolymers having higher molecular weights.

Considering these points, the vinylimidazole content of the copolymer should be within the range from 5 to 90 mol %, preferably from 5 to 50 mol %. Copolymers containing 10–25 mol % of vinylimidazole are particularly preferred since they have satisfactory characteristics in both strippability and sensitivity.

The copolymers can be made by polymerization in solvents, especially in water, using the known starting materials. See Haaf et al., "Polymers of N-vinylpyrrolidone: Synthesis Characterization and Uses", *Polymer Journal*, Vol. 17, No. 1, pages 143–152 (1985).

For the same reason, polyvinylpyrrolidone having higher molecular weights is used with advantage.

The water-soluble polymers are used with advantage if they have K values of 30–100, preferably 50–100, more preferably 60–95. The K value is dependent on molecular weight and should satisfy the following relations (1) and (2):

$$\frac{\log \eta_r}{C} = \frac{75K_o^2 + K_o}{1 + 1.5K_oC}. \quad (1)$$

$$K = 1000K_o \quad (2)$$

(where C is the weight in grams of the water-soluble polymer contained in 100 ml of its aqueous solution; $\eta_r$ is the relative viscosity of the polymer).

The term "relative viscosity" means the specific viscosity of a solution relative to its solvent. If the viscosity of a solution of a certain concentration (in the case under consideration, the solution has one gram of the water-soluble polymer dissolved in 100 ml of water) is written as $\eta$ and the viscosity of the solvent as $\eta_o$, the relative viscosity ($\eta_r$) is given by $\eta/\eta_o$. If the K value exceeds 100, the viscosity of the polymer is so high that difficulty is involved in controlling the thickness of the photoresist film and, in addition, its strippability deteriorates. If the K value is less than 30, the photocurability of the polymer deteriorates, making it difficult to form a desired photocured pattern.

Examples of the water-soluble high polymers that are compatible with polyvinylpyrrolidone or the copolymer of vinylpyrrolidone and vinylimidazole and which may be mixed with them include homopolymers such as carboxymethyl cellulose, hydroxymethyl cellulose, sodium poly-L- glumate, gelatin, polyacrylamide, poly(vinyl methyl ether), polyvinyl alcohol, polyvinyl acetal and polyethylene oxide, and copolymers such as acrylamide-diacetone acrylamide copolymer, acrylamide-vinyl alcohol copolymer and maleic acid-vinyl methyl ether copolymer.

The other essential component of the resin composition of the invention is a high-polymer compound (or photopolymer) having a structural unit represented by the general formula (I). This photopolymer may be synthesized by first copolymerizing diacetone acrylamide with another monomer, preferably, a water-soluble monomer by a known procedure to prepare a water-soluble polymer (base polymer) and then introducing at least one member of the group of 4-azidobenzaldehyde-2-sulfonic acid and salts thereof into the base polymer by the aldol condensation reaction. However, this is not the sole method to synthesize the photopolymer.

Examples of the "another" monomer that may be copolymerized with diacetone acrylamide include acrylic acid, methacrylic acid, dimethylacrylamide, diethylacrylamide, acryloylmorpholine, dimethylaminoethyl acrylamide and N-vinyl-2-pyrrolidone. Among these, acrylic acid and water-soluble salts thereof, methacrylic acid and water-soluble salts thereof, dimethylacrylamide and acryloylmorpholine are particularly preferred. Also included within the scope of the "another monomer" is vinyl acetate which, after copolymerization, may be subjected to a hydrolytic reaction so as to generate an alcoholic hydroxyl group. These examples of the "another monomer" may be used either alone or in combination.

When copolymerizing diacetone acrylamide with a water-soluble monomer as "another example", one mole of diacetone acrylamide is preferably reacted with 0.5–10 moles, more preferably 1.5–6.0 moles, most preferably 1.5–3.0 moles, of the water-soluble monomer. If the proportion of the water-soluble monomer exceeds 10 moles per mole of diacetone acrylamide, the light sensitivity of the resin composition may potentially decrease; below 0.5 moles, the solubility of the resin composition may potentially decrease.

The thus prepared water-soluble polymer for use in the invention has preferably a weight-average molecular weight of $10\times10^4$–$100\times10^4$, more preferably $20\times10^4$–$50\times10^4$. The degree of dispersion of the polymer ranges typically from 1 to 10, preferably from 1 to 3, more preferably from 1 to 2.

When at least one member of the group consisting of 4-azidobenzaldehyde-2-sulfonic acid and salts thereof is to be introduced into the water-soluble polymer of interest by the aldol condensation reaction, the amount of introduction of that member should range typically from 5 to 95 mol %, with diacetone acrylamide being taken as 100 mol %, from the viewpoint of sensitivity characteristics; preferably, the amount of introduction ranges from 30 to 90 mol %, more preferably from 50 to 90 mol %, most preferably from 80 to 90 mol %.

In this way, one can prepare the high-polymer compound (i.e., photopolymer) having a structural unit represented by the general formula (I).

If vinyl acetate is used as the water-soluble monomer, it is copolymerized with diacetone acrylamide and the acetate group is hydrolyzed with an alkali to synthesize a hydroxyl-containing water-soluble polymer. This OH-containing water-soluble polymer is used with advantage since a water-soluble polymer capable of forming patterns of extremely high water resistance can be prepared by introducing aldehydes in acidic aqueous solution through the reaction of acetal formation.

Exemplary aldehydes include: aliphatic aldehydes such as formaldehyde, acetaldehyde, propionaldehyde, n-butylaldehyde and crotonaldehyde; aromatic aldehydes such as benzaldehyde, dialkylbenaldehydes, alkylbenzaldehydes and cinnamic aldehyde; and heterocyclic aldehydes such as pyridinealdehyde. Also included within the category of aldehydes are 4-azidobenzaldehyde-2-sulfonic acid and salts, as well as formylstyrylpyridine and quaternary salts thereof. The aldehydes listed above may be used either alone or in combination. Preferred for practical purposes are propionaldehyde, n-butylaldehyde and crotonaldehyde, with n-butylaldehyde being most preferred.

The reaction with aldehydes for acetal formation is preferably carried out to such an extent that no more than 15 mol % of the hydroxyl groups in the water-soluble polymer is converted to acetal. If more than 15 mol % of the OH groups is converted to acetal, it is difficult to prepare water-soluble polymers having high stability.

The high-polymer compound (photopolymer) having a structural unit presented by the general formula (I) is highly sensitive and, upon exposure to an illumination intensity of 10 mJ/cm$^2$, sensitization is possible up to 13–20 steps in the gray-scale method (using Kodak Photographic Step Tablet No.2). Sensitivities better than 20 steps could be attained if the proportion of the water-soluble monomer unit in the photopolymer and the amount of introduction of the azide compound were selected appropriately; however, beyond 20 steps, the photosensitive composition is too sensitive to exhibit good storage stability and difficulty is encountered in its handling.

Besides the essential components described above, the photosensitive resin composition of the invention may optionally incorporate compatible polymers and additives such as colorants, plasticizers, surfactants and coupling agents for further enhancing adhesion to the substrate. It is particularly noted that incorporating polyvinyl alcohol or modified polyvinyl alcohol as a compatible polymer is effective in improving the strippability of photoresist patterns. The polyvinyl alcohol and modified polyvinyl alcohol may be either partially or completely saponified so long as they exhibit water solubility. Polyvinyl alcohol may be modified in various ways such as by modification with diacetone acrylamide, acryloylmorpholine and N-vinyl-2-pyrrolidone or by attaching silicone-containing groups to side chains. The compatible polymers and additives may be used either alone or in combination.

The preferred proportions of the two essential components of the water-soluble photosensitive resin composition of the invention are such that the ratio of the high-polymer compound (photopolymer) having a structural unit represented by the general formula (I) to the water-soluble polymer ranges from 0.01 to 0.50 on a weight basis and the range of 0.05–0.20 is particularly preferred. If the weight ratio exceeds 0.50, the sensitivity of the resin composition becomes so high that difficulty is encountered in controlling the exposure. If the weight ratio is less than 0.01, the sensitivity of the resin composition is insufficient to serve practical purposes.

The second aspect of the invention will now be described. It relates to a method of forming black matrix patterns using the water-soluble photosensitive resin composition according to the first aspect of the invention. The method comprises the steps of forming a photocured pattern on a substrate using the water-soluble photosensitive resin composition, applying a light absorber to the entire surface of the substrate, drying the applied coat and stripping away the photocured pattern and the overlying light absorber, thereby forming a black matrix pattern.

Stated more specifically, the method starts with preparing a coating solution by dissolving the water-soluble photosensitive resin composition in water at a concentration of, say, about 1–12 wt %, and applying it to a glass substrate. The water-soluble photosensitive resin composition according to the first aspect of the invention has such high photocrosslinking efficiency that even if it is applied in a thin film that provides a photoresist layer with a thickness of only about 0.1–0.5 μm, a desired photocured pattern can be formed without any pattern distortion or washout by development after exposure. This contributes to the reduction of manufacturing cost. If the photosensitive resin composition is applied by spin coating, the thickness of the photoresist layer can be controlled by varying the rotational speed.

In the next step, the applied water-soluble photosensitive resin composition is dried to form the photoresist layer, which is exposed through a shadow mask. An advantageous exposing light source is an ultraviolet lamp that emits uv radiation, in particular, light having a wavelength near 300–400 nm. The intensity of exposure, which varies somewhat with the formulation of the water-soluble photosensitive resin composition, ranges preferably within from about 1 to 10 $mJ/cm^2$. Using the water-soluble photosensitive resin composition of the invention, one can perform gap exposure and obtain a satisfactory photocured pattern showing reciprocity law failure characteristics. The reason for this is not clear but would be explained as follows. When the azido groups in the photoresists layer are excited upon exposure, nitrenes are generated and they react either with themselves or with the polymer and crosslinking occurs to cause photocuring. However, the generated nitrenes are such that in the presence of oxygen or water, the intended crosslinking reaction competes with the non-crosslinking reaction with oxygen or water and, hence, is restrained. A vinylpyrrolidone-containing polymer such as polyvinylpyrrolidone (PVP) has particularly high oxygen permeability, so during gap exposure, aerial oxygen is efficiently taken into the photoresist layer and reacts with the internal nitrenes to restrain the crosslinking reaction. Thus, the intended photocuring reaction occurs in those areas of high illumination intensity which correspond to the centers of beam passing holes whereas said reaction is restrained in those areas of low illumination intensity which correspond to the peripheral edges of beam passing holes and the resulting photocured pattern consists of smaller dots than the perforations (beam passing holes) in the shadow mask. Thus, the "docking" effect which frequently occurs in the prior art is prevented. On the other hand, the overall sensitivity of the photoresist layer is reduced and correspondingly higher illumination intensity is required to give the desired dot diameter. In this aspect, the high polymer having a structural unit represented by the general formula (I) is highly sensitive and allows the intended crosslinking reaction to proceed efficiently under low-intensity illumination. Substituting the vinylpyrrolidone-vinylimidazole copolymer for polyvinylpyrrolidone provides even higher sensitivity and, hence, is preferred. It goes without saying that photocured patterns faithful to mask patterns can also be formed by using the water-soluble photosensitive resin composition of the invention in contact exposure (with the mask placed in contact with the photoresist layer).

Following the exposure, development is performed to remove the unexposed areas to form a photocured pattern on the glass substrate. Any of the known development techniques can be employed. In the present invention, the photoresist layer can be formed in a thin film and yet a desired photocured pattern can be produced without the occurrence of pattern distortion, washout or any other problems during development.

The photocured pattern is then dried and a solution containing a light absorber is applied to the entire surface of the substrate including the photocured pattern and the uncovered area. The applied coat is dried and, subsequently, not only the photocured pattern but also the overlying light absorber is stripped away, thereby forming a black matrix pattern. The light absorber to be used is not limited to any particular type and common graphite is used with advantage. To remove the photocured pattern and the overlying light absorber, customary strippers may be used and they include: hypochlorous acid; hypochlorites such as sodium hypochlorite; hydrogen peroxide; peroxosulfuric acid; peroxosulfates such as potassium peroxosulfate; periodic acid; periodates such as potassium periodate; as well as acidic aqueous solutions of permanganic acid and sulfamic acid compounds. The water-soluble photosensitive resin composition of the invention can be readily stripped away with these generally known strippers.

The thus produced black matrix pattern is applied to a color CRT in the following manner. Specified black matrix holes or stripes are filled with red, blue and green primary phosphors to construct a panel. Electron beams emitted three electron gun(s) are passed through the perforations in the shadow mask to illuminate predetermined phosphors, thereby producing a color image. By applying the water-soluble photosensitive resin composition of the first aspect of the invention, as well as the method of forming a black matrix pattern according to the second aspect, sharp and high-contrast color images can be produced.

The following examples are provided for further illustrating the present invention but are in no way to be taken as limiting.

EXAMPLES

I. Production of Water-Soluble Photosensitive Resin Composition

Production Example 1

1-1. Synthesis of Solution of Water-Soluble Polymer (Base Polymer) a

Dimethylacrylamide (265 g), diacetone acrlylamide (225 g) and pure water (6.51 kg) were charged into a flask and heated under bubbling with nitrogen gas. When the temperature reached 65° C., the supply of nitrogen gas was stopped and 50 g of 2,2'-azobis-[2-(2'-imidazolin-2-yl) propane]dibasic acid ("VA-044" of Wako Pure Chemical, Ltd.) was added as a polymerization initiator, whereupon the temperature of the reaction solution rose to 75° C. Reaction was carried out for 2 h with the temperature maintained at 75° C. Thereafter, the reaction mixture was cooled to room temperature (25° C.) and subsequently heated to 70° C. to precipitate a polymer. The polymer was separated by decantation and diluted with pure water to yield 7.5 kg of a solution of water-soluble polymer (base polymer) a having a solids content of 6 wt %. Analysis showed that the water-soluble polymer a had an average molecular weight of $25 \times 10^4$ (as determined by the DMF method with reference to polystyrene).

1-2. Synthesis of Solution of Photopolymer a'

Thirty-five grams of sodium 4-azidobenzaldehyde-2-sulfonate was added to 1 kg of the solution of base polymer a which was synthesized in 1-1. To the resulting solution, 20 ml of an aqueous solution of 10% sodium hydroxide was added and reaction was carried out at room temperature (25° C.) for 6 h. Thereafter, the reaction mixture was neutralized with dilute hydrochloric acid and diluted with pure water to yield a solution of photopolymer a' having a solids content of 2 wt %.

A grained aluminum plate was whirl-coated with the solution of photopolymer a' and dried to form a dry coat in a thickness of 0.5 μm. The product was measured for sensitivity by the gray-scale method in the following manner: a gray scale (Kodak Photographic Step Tablet No.2) was placed in intimate contact with the photopolymer coat, exposed to ultraviolet light (10 mJ/cm$^2$) from an ultrahigh pressure mercury lamp and developed under running pure water. Following dyeing with an aqueous solution of methyl violet, the photopolymer coat was washed with water and dried. Photocuring occurred up to 20 steps, indicating that the photopolymer under test had satisfactory sensitivity.

1-3. Preparation of Sample A

A polyvinylpyrrolidone (PVP) powder (K value=90) was dissolved in pure water to prepare an aqueous solution at a concentration of 3 wt %. The solution was mixed with the solution of photopolymer a' in such amounts that the ratio of photopolymer a' to PVP was 0.10 on a weight basis. The mixture was diluted with pure water to prepare sample A having a viscosity of 100 cP at 25° C.

Evaluating the Sensitivity of Sample A

Sample A was diluted with pure water to prepare an aqueous solution having a solids content of 2 wt % and evaluated for sensitivity as in 1-2, except that the solution of photopolymer a' having a solids content of 2 wt % was replaced by the prepared solution of sample A. Photocuring occurred up to 13 steps, indicating that sample A had satisfactory sensitivity.

Production Example 2

2-1. Synthesis of Solution of Water-Soluble Polymer (Base Polymer) b

Acryloylmorpholine (350 g), diacetone acrylamide (140 g) and pure water (5.51 kg) were charged into a flask and heated under bubbling with nitrogen gas. When the temperature reached 65° C., the supply of nitrogen gas was stopped and 50 g of 2,2'-azobis-[2-(2'-imidazolin-2-yl)propane]dibasic acid ("VA-044" of Wako Pure Chemical, Ltd.) was added as a polymerization initiator, whereupon the temperature of the reaction solution rose to 75° C. Reaction was carried out for 2 h with the temperature maintained at 75° C. Thereafter, the reaction mixture was cooled to room temperature (25° C.) and subsequently heated to 65° C. to precipitate a polymer. The polymer was separated by decantation and diluted with pure water to yield 6.5 kg of a solution of water-soluble polymer (base polymer) b having a solids content of 7.39 wt %. Analysis showed that the water-soluble polymer b had an average molecular weight of 24×10$^4$ (as determined by the DMF method with reference to polystyrene).

2-2. Synthesis of Solution of Photopolymer b'

Twenty-nine grams of sodium 4-azidobenzaldehyde-2-sulfonate was added to 1 kg of the solution of base polymer b which was synthesized in 2-1. To the resulting solution, 20 ml of an aqueous solution of 10% sodium hydroxide was added and reaction was carried out at room temperature (25° C.) for 7 h. Thereafter, the reaction mixture was neutralized with dilute hydrochloric acid and diluted with pure water to yield a solution of photopolymer b' having a solids content of 2 wt %.

The solution of photopolymer b' was evaluated for sensitivity as in Production Example 1. Photocuring occurred up to 19 steps, indicating that the photopolymer under test had satisfactory sensitivity.

2-3. Preparation of Sample B

A polyvinylpyrrolidone (PVP) powder (K value=90) was dissolved in pure water to prepare an aqueous solution at a concentration of 3 wt %. The solution was mixed with the solution of photopolymer b' in such amounts that the ratio of photopolymer b' to PVP was 0.10 on a weight basis. The mixture was diluted with pure water to prepare sample B having a viscosity of 95 cP at 25° C.

Evaluating the Sensitivity of Sample B

Sample B was evaluated for sensitivity as in Production Example 1, except that sample A was replaced by sample B. Photocuring occurred up to 12 steps, indicating that sample B had satisfactory sensitivity.

Production Example 3

3-1. Synthesis of Solution of Water-Soluble Polymer (Base Polymer) c

Acrylic acid (97 g), diacetone acrylamide (113 g) and pure water (2.79 kg) were charged into a flask to prepare an aqueous solution. Following the addition of sodium hydroxide (25 g), the mixture was heated under bubbling with nitrogen gas. When the temperature reached 65° C., the supply of nitrogen gas was stopped and 15 g of 2,2'-azobis-[2-(2'-imidazolin-2-yl)propane]dibasic acid ("VA-044" of Wako Pure Chemical, Ltd.) was added as a polymerization initiator, whereupon the temperature of the reaction solution rose to 72° C. Upon subsequent heating to 80° C., reaction was carried out for 1.5 h with the temperature maintained at 80° C. Thereafter, the reaction mixture was cooled to room temperature (25° C.) and subsequently heated to 65° C. to precipitate a polymer. The polymer was separated by decantation and diluted with pure water to yield 2.4 kg of a solution of water-soluble polymer (base polymer) c having a solids content of 8.30 wt %. Analysis showed that the water-soluble polymer c had an average molecular weight of 20× 10$^4$ (as determined by the DMF method with reference to polystyrene).

3-2. Synthesis of Solution of Photopolymer c'

Fifteen grams of sodium 4-azidobenzaldehyde-2-sulfonate was added to 0.3 kg of the solution of base polymer c which was synthesized in 3-1. To the resulting solution, pure water was added to make 500 g of an aqueous solution. Subsequently, 8 ml of an aqueous solution of 10% sodium hydroxide was added and reaction was carried out at room temperature (25° C.) for 8 h. Thereafter, the reaction mixture was neutralized with dilute hydrochloric acid and diluted with pure water to yield a solution of photopolymer c' having a solids content of 2 wt %.

The solution of photopolymer c' was evaluated for sensitivity as in Production Example 1. Photocuring occurred up to 16 steps, indicating that the photopolymer under test had satisfactory sensitivity.

3-3. Preparation of Sample C

A polyvinylpyrrolidone (PVP) powder (K value=90) was dissolved in pure water to prepare an aqueous solution at a concentration of 6 wt %. The solution was mixed with the solution of photopolymer c' in such amounts that the ratio of photopolymer c' to PVP was 0.10 on a weight basis. The mixture was diluted with pure water to prepare sample C having a viscosity of 100 cP at 25° C.

Evaluating the Sensitivity of Sample C

Sample C was evaluated for sensitivity as in Production Example 1, except that sample A was replaced by 29 sample C. Photocuring occurred up to 13 steps, indicating that sample C had satisfactory sensitivity.

Production Example 4

4-1. Synthesis of Solution of Water-Soluble Polymer (Base Polymer) d

Methacrylic acid (106 g), diacetone acrylamide (104 g) and pure water (2.79 kg) were charged into a flask to prepare an aqueous solution. Following the addition of sodium hydroxide (32 g), the mixture was heated under bubbling with nitrogen gas. When the temperature reached 65° C., the supply of nitrogen gas was stopped and 15 g of 2,2'-azobis-[2-(2'-imidazolin-2-yl)propane]dibasic acid ("VA-044" of Wako Pure Chemical, Ltd.) was added as a polymerization initiator, whereupon the temperature of the reaction solution rose to 75° C. Upon subsequent heating to 80° C., reaction was carried out for 1.5 h with the temperature maintained at 80° C. Thereafter, the reaction mixture was cooled to room temperature (25° C.) and subsequently heated to 65° C. to precipitate a polymer. The polymer was separated by decantation and diluted with pure water to yield 2.4 kg of a solution of water-soluble polymer (base polymer) d having a solids content of 8.40 wt %. Analysis showed that the water-soluble polymer d had an average molecular weight of $21 \times 10^4$ (as determined by the DMF method with reference to polystyrene).

4-2. Synthesis of Solution of Photopolymer d'

Fifteen grams of sodium 4-azidobenzaldehyde-2-sulfonate was added to 0.3 kg of the solution of base polymer d which was synthesized in 4-1. To the resulting solution, pure water was added to make 500 g of an aqueous solution. Subsequently, 8 ml of an aqueous solution of 10% sodium hydroxide was added and reaction was carried out at room temperature (25° C.) for 8 h. Thereafter, the reaction mixture was neutralized with dilute hydrochloric acid and diluted with pure water to yield a solution of photopolymer d' having a solids content of 2 wt %.

The solution of photopolymer d' was evaluated for sensitivity as in Production Example 1. Photocuring occurred up to 16 steps, indicating that the photopolymer under test had satisfactory sensitivity.

4-3. Preparation of Sample D

A polyvinylpyrrolidone (PVP) powder (K value=90) was dissolved in pure water to prepare an aqueous solution at a concentration of 6 wt %. The solution was mixed with the solution of photopolymer d' in such amounts that the ratio of photopolymer d' to PVP was 0.10 on a weight basis. The mixture was diluted with pure water to prepare sample D having a viscosity of 100 cP at 25° C.

Evaluating the Sensitivity of Sample D

Sample D was evaluated for sensitivity as in Production Example 1, except that sample A was replaced by sample D. Photocuring occurred up to 13 steps, indicating that sample D had satisfactory sensitivity.

Comparative Production Example 1

Preparation of Comparative Sample X

A polyvinylpyrrolidone (PVP) powder (K value=90) was dissolved in pure water to prepare an aqueous solution at a concentration of 3 wt %. The solution was mixed with 4,4'-diazidostilbene-2,2'-disulfonic acid disodium salt in such amounts that the ratio of 4,4'-diazidostilbene-2,2'-disulfonic-acid disodium salt to PVP was 0.10 on a weight basis. The mixture was diluted with pure water to prepare comparative sample X having a viscosity of 95 cP at 25° C.

Evaluating the Sensitivity of Comparative Sample X

Comparative sample X was diluted with pure water to prepare an aqueous solution having a solids content of 3 wt %. An aluminum substrate was whirl-coated with the prepared aqueous solution and dried to form a dry coat in a thickness of 1.0 μm. The dry coat was measured for sensitivity by the gray-scale method as Production Example 1. Photocuring occurred up to only 8 steps, indicating that comparative sample X had lower sensitivity than samples A–D.

Production Example 5

A polyvinylpyrrolidone (PVP) powder (K value=90) was dissolved in pure water to prepare an aqueous solution at a concentration of 3 wt %. The solution was mixed with the solution of photopolymer a' (see under 1-2 in Production Example 1) in such amounts that the ratio of photopolymer a' to PVP was 0.03 on a weight basis. The mixture was diluted with pure water to prepare sample E having a viscosity of 100 cP at 25° C.

Evaluating the Sensitivity of Sample E

Sample E was evaluated for sensitivity as in Production Example 1 except that sample A was replaced by sample E. Photocuring occurred up to 9 steps, indicating that sample E had satisfactory sensitivity.

Production Example 6

A polyvinylpyrrolidone (PVP) powder (K value=90) was dissolved in pure water to prepare an aqueous solution at a concentration of 3 wt %. The solution was mixed with the solution of photopolymer a' (see under 1-2 in Production Example 1) in such amounts that the ratio of photopolymer a' to PVP was 0.20 on a weight basis. The mixture was diluted with pure water to prepare sample F having a viscosity of 100 cP at 25° C.

Evaluating the Sensitivity of Sample F

Sample F was evaluated for sensitivity as in PRODUCTION EXAMPLE 1 except that sample A was replaced by sample F. Photocuring occurred up to 14 steps, indicating that sample F had satisfactory sensitivity.

Production Example 7

A polyvinylpyrrolidone (PVP) powder (K value=90) was dissolved in pure water to prepare an aqueous solution at a concentration of 3 wt %. The solution was mixed with the solution of photopolymer a' (see under 1-2 in Production Example 1) in such amounts that the ratio of photopolymer a' to PVP was 0.40 on a weight basis. The mixture was diluted with pure water to prepare sample G having a viscosity of 100 cP at 25° C.

Evaluating the Sensitivity of Sample G

Sample G was evaluated for sensitivity as in Production Example 1 except that sample A was replaced by sample G. Photocuring occurred up to 18 steps, indicating that sample G had satisfactory sensitivity.

Production Example 8

A polyvinylpyrrolidone (PVP) powder (K value=60) was dissolved in pure water to prepare an aqueous solution at a concentration of 6.5 wt %. The solution was mixed with the solution of photopolymer a' (see under 1-2 in Production Example 1) in such amounts that the ratio of photopolymer a' to PVP was 0.10 on a weight basis. The mixture was diluted with pure water to prepare sample H having a viscosity of 100 cP at 25° C.

Evaluating the Sensitivity of Sample H

Sample H was diluted with pure water to prepare an aqueous solution having a solids content of 3 wt %. An aluminum substrate was whirl-coated with the prepared aqueous solution and dried to form a dry coat in a thickness of 0.8 μm. The dry coat was measured for sensitivity by the gray-scale method as in Production Example 1. Photocuring occurred up to 10 steps, indicating that sample H had satisfactory sensitivity.

Production Example 9

9-1. Synthesis of Solution of Water-Soluble Polymer (Base Polymer) e

A solution of water-soluble polymer (base polymer) e having a solids content of 5.00 wt % was prepared as in Production Example 4, except that methacrylic acid and diacetone acrylamide were charged in respective amounts of 86 g and 114 g. Analysis showed that the water-soluble polymer e had an average molecular weight of $25 \times 10^4$ (as determined by the DMF method with reference to polystyrene), with the content of diacetone acrylamide being 40 mol %.

9-2. Synthesis of Solution of Photopolymer e'

Four grams of sodium 4-azidobenzaldehyde-2-sulfonate was added to 0.1 kg of the solution of base polymer e which was synthesized in 9-1. To the resulting solution, 2 ml of an aqueous solution of 10% sodium hydroxide was added and reaction was carried out at room temperature (25° C.) for 7 h. Thereafter, the reaction mixture was neutralized with dilute hydrochloric acid and diluted with pure water to yield a solution of photopolymer e' having a solids content of 7 wt %.

A grained aluminum plate was whirl-coated with the solution of photopolymer e' and dried to form a dry coat in a thickness of 0.5 µm. The product was measured for sensitivity by the gray-scale method in the following manner: a gray scale (Kodak Photographic Step Tablet No.2) was placed in intimate contact with the photopolymer coat, exposed to ultraviolet light (10 mJ/cm$^2$) from an ultrahigh pressure mercury lamp and developed under running pure water. Following dyeing with an aqueous solution of methyl violet, the photopolymer coat was washed with water and dried. Photocuring occurred up to 18 steps, indicating that the photopolymer under test had satisfactory sensitivity.

9-3. Preparation of Sample I

Seven grams of vinylpyrrolidone-vinylimidazole (VP-VI) copolymer powder [K value=90; VP/VI=90/10 (ratio in mol %)] was dissolved in 100 g of pure water. To the resulting solution, 10 g of the solution of photopolymer e' was added, thereby preparing sample I which was a mixture of photopolymer e' and VP-VI at a weight ratio of 0.10.

Evaluating the Sensitivity of Sample I

Sample I was evaluated for sensitivity as in Production Example 1 except that sample A was replaced by sample I. Photocuring occurred up to 15 steps, indicating that sample I had satisfactory sensitivity.

Production Example 10

Sample J was prepared as in Production Example 9 except that the VP-VI copolymer was replaced by PVP (K value= 90).

Evaluating the Sensitivity of Sample J

Sample J was evaluated for sensitivity as in Production Example 1 except that sample A was replaced by sample J. Photocuring occurred up to 13 steps, indicating that sample J had satisfactory sensitivity.

Comparative Production Example 2

Comparative sample Y was prepared as in Production Example 9 except that the solution of photopolymer e' was replaced by 4,4'-diazidostilbene-2,2'-disulfonic acid disodium odium salt and that it was added in an amount of 0.7 g rather than 10 g.

Evaluating the Sensitivity of Comparative Sample Y

Comparative sample Y was evaluated for sensitivity as in Production Example 1 except that sample A was replaced by comparative sample Y. Photocuring occurred up to only 8 steps.

Comparative Production Example 3

Comparative sample Z was prepared as in Comparative Production Example 2 except that the VP-VI copolymer was replaced by PVP (K value=90).

Evaluating the Sensitivity of Comparative Sample Z

Comparative sample Z was evaluated for sensitivity as in Production Example 1 except that sample A was replaced by comparative sample Z. Photocuring reaction did not proceed sufficiently to prevent pattern washout during development.

Production Example 11

Sample K was prepared as in Production Example 9 except that the VP-VI copolymer was replaced by one having a K value of 80 and a VP/VI ratio of 80:20 in mol %.

Evaluating the Sensitivity of Sample K

Sample K was evaluated for sensitivity as in Production Example 1 except that sample A was replaced by sample K. Photocuring occurred up to 12 steps, indicating that sample K had satisfactory sensitivity.

Production Example 12

Sample L was prepared as in Production Example 9 except that the VP-VI copolymer was replaced by one having a K value of 60 and a VP/VI ratio of 75:25 in mol %.

Evaluating the Sensitivity of Sample L

Sample L was evaluated for sensitivity as in Production Example 1 except that sample A was replaced by sample L. Photocuring occurred up to 10 steps, indicating that sample L had satisfactory sensitivity.

II. Formation of Black Matrix Patterns

Example 1

Fifty grams of sample A prepared in Production Example 1, 50 g of pure water and 1 g of a 10% aqueous solution of a nonionic surfactant ("LT-221" of Nippon Oil & Fats Co., Ltd.) were mixed to prepare a coating solution. A clean glass plate (125 mmφ) was provided as a substrate and whirl-coated with the thus prepared coating solution at 120 rpm. The applied coat was dried at 50° C. for 15 min to form a photoresist layer in a thickness of 1.0 µm.

A shadow mask having perforations in a specified dot pattern was placed above the photoresist layer with the gap spacing being 10 mm. The photoresist layer was subjected to point source exposure to an ultrahigh pressure mercury lamp producing light at a wavelength near 350 nm. The illumination intensity was 0.15 mW/cm$^2$ and the exposure time was varied at 10, 20, 30 or 40 seconds.

After the exposure, water development was conducted to wash away the unexposed areas and the substrate was dried with hot air at 50° C. for 10 min to produce a photocured pattern.

The entire surface of the glass substrate including the photocured pattern and the uncovered areas was whirl-coated with a graphite slurry ("GA-66S" of Hitachi Powdered Metals Co., Ltd.) at 150 rpm and dried at 50° C. for 15 min.

Figure 1:
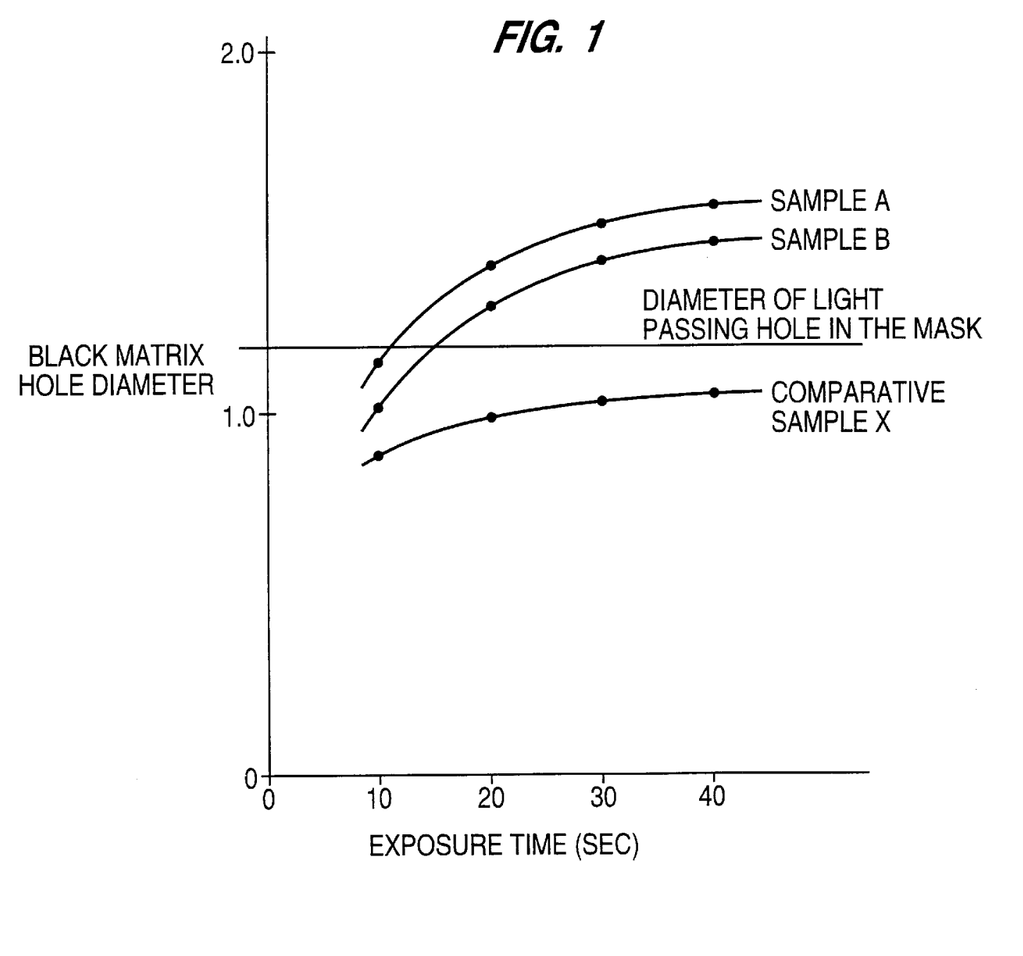
FIG. 1 is a graph showing the relationship between the time of exposure on samples A and B as well as comparative sample X and the diameter of black matrix holes formed in those samples.

The substrate was then immersed in an aqueous solution of 15% hydrogen peroxide at 50° C. for 1 min and washed with water at a pressure of 4 kg/cm$^2$ to produce a black matrix pattern that had few fringes and which had holes formed in registry with the perforations in the shadow mask. The average diameter of the black matrix holes was measured for varying exposure times and the results are shown in FIG. 1 and Table 1 by relative values, with the hole diameter in comparative sample X (after 20-sec exposure and water development) being taken as the reference (1.00).

Example 2

Fifty grams of sample B prepared in Production Example 2, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in FIG. 1 and Table 1.

Comparative Example 1

Fifty grams of comparative sample X prepared in Comparative Production Example 1, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes as in Examples 1 and 2. The average diameter of the black matrix holes was measured for varying exposure times and the results are shown in FIG. 1 and Table 1.

As one can see from the data in FIG. 1 and Table 1 for Examples 1 and 2, as well as COMPARATIVE EXAMPLE 1, comparative sample X did not photocure in the areas of low illumination intensity (i.e., corresponding to the peripheral edges of the light passing holes in the mask) even after prolonged exposure and illumination with light of comparatively high intensity was necessary for providing the desired pattern size, say, 1.00. In contrast, samples A and B ensured that the intended crosslinking reaction would proceed efficiently even in the areas that were illuminated with light of low intensity and, hence, desired patterns could be formed with small amount of exposing light; in addition, the exposure time necessary to produce the desired hole diameter was no more than one half the time required by comparative sample X.

Example 3

Fifty grams of sample C prepared in Production Example 3, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in Table 1.

Example 4

Fifty grams of sample D prepared in Production Example 4, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in Table 1.

Example 5

Fifty grams of sample E prepared in Production Example 5, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in Table 1.

Example 6

Fifty grams of sample F prepared in Production Example 6, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in Table 1.

Example 7

Fifty grams of sample G prepared in Production Example 7, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in Table 1.

Example 8

Fifty grams of sample H prepared in Production Example 8, 50 g of pure water and 1 g of a 10% aqueous solution of a nonionic surfactant ("LT-221" of Nippon Oil & Fats Co., Ltd.) were mixed to prepare a coating solution.

Black matrix patterns were formed as in Example 1 using the prepared coating solution. Each pattern had few fringes and had holes formed in registry with the perforations in the shadow mask. The average diameter of the black matrix holes was measured for varying exposure times and the results are shown in Table 1.

Example 9

A black matrix pattern was formed as in Example 1 except that the thickness of the photoresist layer was reduced to 0.5 $\mu$m. As Table 1 shows, exposure no longer than 10 seconds was sufficient to form a satisfactory pattern consisting of holes with a diameter of 1.05 by relative value.

Comparative Example 2

Exposure and development were conducted as in Comparative Example 1 except that the thickness of the photoresist layer was reduced to 0.5 $\mu$m. As Table 1 shows, pattern washout occurred during water development whether the exposure time was 10, 20 or 30 seconds. When the exposure time was 40 seconds, there was formed a black matrix pattern consisting of holes with an average diameter of 0.51 by relative value; however, the holes had too many fringes to be in good shape.

TABLE 1

| Run No. | Sample | Sensitivity (a) | PSC/PVP (weight ratio) | K value of PVP | Film thickness (um) | Hole diameter(*1) vs exposure time (sec) | | | |
|---|---|---|---|---|---|---|---|---|---|
| | | | | | | 10 | 20 | 30 | 40 |
| Ex. 1 | A | 13 | 0.10 | 90 | 1.0 | 1.16 | 1.42 | 1.54 | 1.59 |
| Ex. 2 | B | 12 | 0.10 | 90 | 1.0 | 1.03 | 1.31 | 1.43 | 1.49 |
| Comp. Ex. 1 | X | 8 (b) | 0.10 | 90 | 1.0 | 0.90 | 1.00 | 1.05 | 1.06 |
| Ex. 3 | C | 13 | 0.10 | 90 | 1.0 | 1.02 | 1.30 | 1.42 | 1.47 |
| Ex. 4 | D | 13 | 0.10 | 90 | 1.0 | 1.01 | 1.28 | 1.40 | 1.46 |
| Ex. 5 | E | 9 | 0.03 | 90 | 1.0 | 0.92 | 1.12 | 1.22 | 1.26 |
| Ex. 6 | F | 14 | 0.20 | 90 | 1.0 | 1.51 | 1.85 | 2.00 | 2.01 |
| Ex. 7 | G | 18 | 0.40 | 90 | 1.0 | 2.30 | 2.83 | 3.06 | 3.15 |
| Ex. 8 | H | 10 (c) | 0.10 | 60 | 1.0 | 1.10 | 1.35 | 1.46 | 1.51 |
| Ex. 9 | A | 13 | 0.10 | 90 | 0.5 | 1.05 | — | — | — |
| Comp. Ex. 2 | X | — | 0.10 | 90 | 0.5 | x (*2) | x (*2) | x (*2) | 0.51 (*3) |

PSC: photosensitive composition;
PVP: polyvinylpyrrolidone
Notes)
a: Evaluated at solids content of 2 wt % in film thickness of 0.5 μm with an exposure of 10 mJ/cm$^2$.
b: Evaluated at solids content of 3 wt % in film thickness of 1.0 μm with an exposure of 10 mJ/cm$^2$.
c: Evaluated at solids content of 3 wt % in film thickness of 0.8 μm with an exposure of 10 mJ/cm$^2$.
*1: Black matrix hole diameter is expressed in relative values, with the value for comparative sample X (after 20-sec exposure and water development) being taken as 1.00.
*2: Photocured pattern was not formed.
*3: Too many fringes to create holes in good shape.

As is clear from Table 1, the water-soluble photosensitive resin compositions described in Examples 1–9 were capable of not only producing desired and satisfactory black matrix hole diameters even with short and low-intensity exposure but also forming photocured patterns with efficiency even when they were applied as thin films.

Example 10

Fifty grams of sample I prepared in Production Example 9, 50 g of pure water, 1 ml of a 10% ethanol solution of silane coupling agent ("KBM603" of Shin-Etsu Silicone Co., Ltd.) and 1 ml of a 10% aqueous solution of a nonionic surfactant ("LT-221" of Nippon Oil & Fats Co., Ltd.) were mixed to prepare a coating solution. A clean glass plate (125 mmφ) was provided as a substrate and whirl-coated with the thus prepared coating solution at 120 rpm. The applied coat was dried at 50° C. for 15 min to form a photoresist layer in a thickness of 1.0 μm.

A shadow mask having perforations in a specified dot pattern was placed above the photoresist layer with the gap spacing being 10 mm. The photoresist layer was subjected to point source exposure to an ultrahigh pressure mercury lamp producing light at a wavelength near 350 nm. The illumination intensity was 0.10 mW/cm$^2$ and the exposure time was 25 seconds.

After the exposure, water development was conducted to wash away the unexposed areas and the substrate was dried with hot air at 50° C. for 10 min to produce a photocured pattern.

The entire surface of the glass substrate including the photocured pattern and the uncovered areas was whirl-coated with a 2-fold dilution of graphite slurry ("Hitazol GA-66M" of Hitachi Powdered Metals Co., Ltd.) at 150 rpm and dried at 50° C. for 15 min.

The substrate was then immersed in a saturated aqueous solution of sulfanic acid at 25° C. for 1 min and washed with water at a pressure of 3 kg/cm$^2$ to produce a black matrix pattern that had no fringes and which had holes formed in registry with the perforations in the shadow mask. The average diameter of the black matrix holes was measured and the photoresist layer was evaluated for sensitivity. The results are shown in Table 2. The data for black matrix hole diameter are shown in Table 2 by relative values, with the hole diameter in comparative sample Z (after 25-sec exposure and water development) being taken as the reference (1.00).

The strippability of the photoresist layers was evaluated in the following manner.

Strippability

A phosphor slurry was applied to the photoresist layer under test and while it was wet, the applied coat was washed off. After drying, a black light source emitting ultraviolet light in the emission wavelength range of the phosphor was used to check for fluorescence emission from the residual phosphor in holes; in addition, visual check was made for the presence of any unstripped portion of the photoresist layer.

Rating

⊚: No part of the photoresist layer remained unstripped.
○: Very thin portion of the photoresist layer remained unstripped but there was no adhesion of the phosphor.
X: Fairly thick portion of the photoresist layer remained unstripped and adhesion of the phosphor occurred in several holes.

Example 11

A coating solution was prepared as in Example 10 except for the use of sample J prepared in Production Example 10. Using the coating solution, a black matrix pattern was formed as in Example 10. The pattern was free from fringes and had holes formed in registry with the perforations in the shadow mask. The average diameter of the black matrix holes was measured and the photoresist layer was evaluated for strippability. The results are shown in Table 2.

Comparative Example 3

A coating solution was prepared as in Example 10 except for the use of comparative sample Y prepared in Comparative Production Example 2. Using the coating solution, a black matrix pattern was formed as in Example 10. The pattern was free from fringes and had holes formed in registry with the perforations in the shadow mask. The average diameter of the black matrix holes was measured and the photoresist layer was evaluated for strippability. The results are shown in Table 2.

Comparative Example 4

A coating solution was prepared as in Example 10 except for the use of comparative sample Z prepared in Comparative Production Example 3. Using the coating solution, a black matrix pattern was formed as in Example 10. The pattern was free from fringes and had holes formed in registry with the perforations in the shadow mask. The average diameter of the black matrix holes was measured and the photoresist layer was evaluated for strippability. The results are shown in Table 2.

Example 12

A coating solution was prepared as in Example 10 except for the use of sample K prepared in Production Example 11. Using the coating solution, a black matrix pattern was formed as in Example 10. The pattern was free from fringes and had holes formed in registry with the perforations in the shadow mask. The average diameter of the black matrix holes was measured and the photoresist layer was evaluated for strippability. The results are shown in Table 2.

Example 13

A coating solution was prepared as in Example 10 except for the use of sample L prepared in Production Example 12. Using the coating solution, a black matrix pattern was formed as in Example 10. The pattern was free from fringes and had holes formed in registry with the perforations in the shadow mask. The average diameter of the black matrix holes was measured and the photoresist layer was evaluated for strippability. The results are shown in Table 2.

Example 14

A black matrix pattern was formed as in Example 10, except that the thickness of the photoresist layer was reduced to 0.5 μm. The pattern was free from fringes and had holes formed in registry with the perforations in the shadow mask. The average diameter of the black matrix holes was measured and the photoresist layer was evaluated for strippability. The results are shown in Table 2.

TABLE 2

| Run No. | Sample | Sensitivity | PSC/WSP (weight ratio) | K value of WSP | Film thickness (um) | Hole diameter (*) | Strippability |
|---|---|---|---|---|---|---|---|
| Ex. 10 | I | 15 | 0.10 | 90 (VP-VI) | 1.0 | 1.40 | ◎ |
| Ex. 11 | J | 13 | 0.10 | 90 (PVP) | 1.0 | 1.32 | ○ |
| Comp. Ex. 3 | Y | 9 | 0.10 | 90 (VP-VI) | 1.0 | 1.20 | ◎ |
| Comp. Ex. 4 | Z | — | 0.10 | 90 (PVP) | 1.0 | 1.00 | x |
| Ex. 12 | K | 12 | 0.10 | 80 (VP-VI) | 1.0 | 1.24 | ◎ |
| Ex. 13 | L | 10 | 0.10 | 60 (VP-VI) | 1.0 | 1.21 | ◎ |
| Ex. 14 | I | 15 | 0.10 | 90 (VP-VI) | 0.5 | 1.13 | ○ |

PSC: photosensitive composition;
WSP: water-soluble polymer
VP-VI: vinylpyrrolidone-vinylimidazole oopolymer;
PVP: polyvinylpyrrolidone
Note)
*: Black matrix hole diameter is expressed in relative values, with the value for comparative sample Z (after 25-sec exposure and water development) being taken as 1.00.

As described above in detail, the water-soluble photosensitive resin composition according to the first aspect of the invention is capable of efficient formation of photocured patterns as thin film and has a potential for reduction in materials cost. In addition, the composition is sensitive enough to enable pattern formation by shorter and lower-intensity exposure, thus contributing to a higher throughput. As a further advantage, the composition has good strippability and substantially no part of the photoresist will remain unstripped, thus ensuring against color mixing due to the adhesion of phosphors. Because of these advantages, products of high quality can be manufactured at a lower cost with better efficiency. The "docking" effect will not occur even in the case of gap exposure and this expands the applicability of the composition since satisfactory photocured patterns can be produced by both contact and gap exposure. If black matrices are manufactured by using the water-soluble photosensitive resin composition and the method of forming black matrix patterns according to the second aspect of the invention, one can produce color images that have high sensitivity and resolution.

What is claimed is:
1. A copolymer of vinylpyrrolidone and vinylimidazole having a content of vinylimidazole of from 5 to 90 mol % and a K value of 50–100.
2. The copolymer of claim 1, wherein the K value is 60–95.

* * * * *

UNITED STATES PATENT AND TRADEMARK OFFICE
CERTIFICATE OF CORRECTION

PATENT NO. : 5,990,269
DATED : November 23, 1999
INVENTOR(S) : KARIN NEUBECKER, et al.

It is certified that error appears in the above-indentified patent and that said Letters Patent is hereby corrected as shown below:

On the Title Page, in the heading "[75] Inventors:", line 3, the phrase "all of United Kingdom" should read --all of Federal Republic of Germany--.

Signed and Sealed this

Seventeenth Day of April, 2001

Attest:

NICHOLAS P. GODICI

Attesting Officer

Acting Director of the United States Patent and Trademark Office